United States Patent
Kim et al.

(10) Patent No.: US 7,868,322 B2
(45) Date of Patent: Jan. 11, 2011

(54) METHOD FOR FABRICATING AN ORGANIC THIN FILM TRANSISTOR BY OXIDATION AND SELECTIVE REDUCTION OF ORGANIC SEMICONDUCTOR MATERIAL

(75) Inventors: Do Hwan Kim, Yongin-si (KR); Jung Seok Hahn, Yongin-si (KR); Sang Yoon Lee, Yongin-si (KR); Bon Won Koo, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 607 days.

(21) Appl. No.: 11/819,036

(22) Filed: Jun. 25, 2007

(65) Prior Publication Data

US 2008/0128684 A1 Jun. 5, 2008

(30) Foreign Application Priority Data

Dec. 1, 2006 (KR) ........................ 10-2006-0120779

(51) Int. Cl.
*H01L 51/30* (2006.01)
*H01L 51/40* (2006.01)

(52) U.S. Cl. .......... 257/40; 257/E51.025; 257/E51.028; 257/E51.029; 257/E51.031; 257/E51.032; 438/99

(58) Field of Classification Search .................... 257/40, 257/E51.025, E51.028, E51.029, E51.031, 257/E51.032; 438/99
See application file for complete search history.

(56) References Cited

U.S. PATENT DOCUMENTS

| | | | | |
|---|---|---|---|---|
| 6,740,900 B2* | 5/2004 | Hirai | | 257/40 |
| 6,794,220 B2* | 9/2004 | Hirai et al. | | 438/99 |
| 7,018,872 B2* | 3/2006 | Hirai et al. | | 438/149 |
| 7,037,767 B2* | 5/2006 | Hirai | | 438/149 |
| 7,081,210 B2* | 7/2006 | Hirai et al. | | 252/62.3 Q |
| 7,391,049 B2* | 6/2008 | Hirai | | 257/40 |
| 7,582,897 B2* | 9/2009 | Hirai et al. | | 257/40 |
| 7,655,566 B2* | 2/2010 | Fujii | | 438/678 |
| 7,682,867 B2* | 3/2010 | Hirai | | 438/99 |
| 7,763,727 B2* | 7/2010 | Fujiyama et al. | | 546/66 |
| 2004/0085598 A1* | 5/2004 | Kokeguchi et al. | | 358/909.1 |
| 2004/0201064 A1* | 10/2004 | Hirai et al. | | 257/347 |
| 2006/0006378 A1* | 1/2006 | Hirai | | 257/40 |
| 2006/0060834 A1* | 3/2006 | Hirai | | 257/40 |
| 2007/0034860 A1* | 2/2007 | Nakamura | | 257/40 |

(Continued)

OTHER PUBLICATIONS

Jianyong Ouyang, et al. "High-Conductivity Poly(3,4-Ethylenedioxythiophene):Poly(styrene sulfonate) Film and Its Application in Polymer Optoelectronics Devices," Advanced Functional Materials, 2005, 15 No. 2, February.

*Primary Examiner*—Anh Phung
*Assistant Examiner*—Michael Lulis
(74) *Attorney, Agent, or Firm*—Harness, Dickey & Pierce, P.L.C.

(57) ABSTRACT

Disclosed is a method for fabricating an organic thin film transistor by oxidation and selective reduction of an organic semiconductor material. According to the method, stability of interfaces between a semiconductor layer and source/drain electrodes of an organic thin film transistor may be guaranteed. Therefore, an organic thin film transistor fabricated by the method may exhibit improved performance characteristics, e.g., minimized or decreased contact resistance and increased charge carrier mobility.

18 Claims, 3 Drawing Sheets

U.S. PATENT DOCUMENTS

2007/0145361 A1* 6/2007 Aramaki et al. ............... 257/40
2007/0221958 A1* 9/2007 Aoki .......................... 257/211
2008/0036367 A1* 2/2008 Eida et al. ................... 313/504

* cited by examiner

METHOD FOR FABRICATING AN ORGANIC THIN FILM TRANSISTOR BY OXIDATION AND SELECTIVE REDUCTION OF ORGANIC SEMICONDUCTOR MATERIAL

PRIORITY STATEMENT

This non-provisional application claims priority under 35 U.S.C. §119 to Korean Patent Application No. 2006-0120779, filed on Dec. 1, 2006, in the Korean Intellectual Property Office (KIPO), the entire contents of which are herein incorporated by reference.

BACKGROUND

1. Field

Example embodiments relate to a method for fabricating an organic thin film transistor. Other example embodiments relate to a method for fabricating a high-performance organic thin film transistor with minimized or decreased contact resistance and increased charge carrier mobility in which an organic semiconductor material may be oxidized and selectively reduced by appropriate treatment, e.g., UV irradiation, to ensure stability of interfaces between a semiconductor layer and source/drain electrodes.

2. Description of the Related Art

Solution-processable organic thin film transistors are devices which may include a semiconductor layer formed of an electrically conductive organic polymer, e.g., polyacetylene, polythiophene and/or polyphenylene. These types of organic thin film transistors may have advantages in that semiconductor layers may be formed by printing processes at ambient pressure and the overall fabrication procedure may be achieved at reduced costs by roll-to-roll processes using plastic substrates. Accordingly, solution-processable organic thin film transistors may be expected to be useful in various applications, e.g., driving devices of active displays and plastic chips for use in smart cards and inventory tags.

Conventional organic thin film transistors may include several constituent elements, e.g., a substrate, a gate electrode, a gate insulating layer, a semiconductor layer and source/drain electrodes, and provide interfaces between these elements, including interfaces between the semiconductor layer and the source/drain electrodes, an interface between the semiconductor layer and the gate insulating layer, interfaces between the source/drain electrodes and the gate insulating layer. Improvements in the performance of constituent elements of organic thin film transistors as well as the stability of interfaces between the respective elements may be required to maximize or increase the performance characteristics of the organic thin film transistors.

Control of the interfacial structure between a semiconductor and source/drain electrodes of organic thin film transistors and an improvement in the electrical properties at interfaces between the constituent elements may be directly connected with the characteristics of the transistors and may be thus regarded as important in improving the characteristics of the transistors. When organic thin film transistors based on a conjugated polymer as a material for a semiconductor layer use a metal (e.g., gold (Au)) as a material for source/drain electrodes, the interfacial characteristics between the semiconductor layer and the metal electrodes may be deteriorated, causing an increase in contact resistance. Ohmic contact between the semiconductor layer and the source/drain electrodes may not be achieved, and instead, a Schottky barrier may be formed, which is the main cause of undesirable characteristics of the transistors.

Various attempts have been made to solve these problems. For example, the related art discloses the production of high-conductivity PEDOT/PSS electrodes by adding an organic solvent having a high dielectric constant. The conductivity of the PEDOT/PSS electrodes may be comparable to that of conventional ITO electrodes, but may not match the conductivity of gold (Au), which is the most conventional electrode material.

SUMMARY

In accordance with example embodiments for solving the problems of the prior art, there is provided a method for fabricating an organic thin film transistor with improved characteristics, e.g., minimized or reduced contact resistance and improved electrical properties, in which an organic semiconductor material may be oxidized using a metal-based oxidant, followed by selective reduction to form metal particles within a semiconductor layer, thereby ensuring stability of interfaces between a semiconductor layer and source/drain electrodes.

In example embodiments, the method may include forming a gate electrode on a substrate, forming a gate insulating layer on the gate electrode, applying an organic semiconductor material oxidized by a metal-based oxidant to the gate insulating layer to form a semiconductor layer, selectively reducing the semiconductor layer to selectively form metal particles therein, and forming source/drain electrodes on the selectively reduced portions of the semiconductor layer.

In example embodiments, the metal-based oxidant may be a material represented by Formula 1 or 2:

$$A_nB_m \qquad (1)$$

wherein A may be selected from the group consisting of gold (Au), platinum (Pt), palladium (Pd), silver (Ag) and copper (Cu), B may be selected from the group consisting of Cl, acetate (OAc) and $NO_3$, n may be 1 or greater, and m may be equal to or greater than n; or

$$H_lA_nB_m \qquad (2)$$

A, B, n and m may be as defined in Formula 1, and l may be 1 or greater.

In example embodiments, the organic semiconductor material m a y be a p-type conjugated polymer. In example embodiments, applying the organic semiconductor material oxidized by a metal-based oxidant to the gate insulating layer to form a semiconductor layer may include dissolving an organic semiconductor material in a solvent to prepare an organic semiconductor solution, dissolving a metal-based oxidant in a solvent to prepare an oxidant solution, and mixing the organic semiconductor solution with the oxidant solution and applying the mixed solution to the gate insulating layer.

Each of the solvents may be selected from the group consisting of organic solvents, water and mixtures thereof. The application of the mixed solution may be performed by printing, screen printing, spin coating, dipping, ink spraying, vacuum evaporation and/or thermal evaporation. In example embodiments, the selective reduction of the oxidized semiconductor material may be performed by irradiation with UV, e-beam, laser and/or x-rays.

In example embodiments, the source/drain electrodes may be made of a material selected from the group consisting of metals, including gold (Au), platinum (Pt), palladium (Pd), silver (Ag), copper (Cu), aluminum (Al), nickel (Ni) and chromium (Cr), and alloys thereof, including molybdenum/tungsten (Mo/W) alloys, metal oxides, including indium-tin oxide (ITO) and indium-zinc oxide (IZO), and electrically conductive polymers, including polythiophene, polyaniline, polyacetylene, polypyrrole, polyphenylene vinylene, and polyethylenedioxythiophene (PEDOT)/polystyrenesulfonate (PSS) mixtures.

In accordance with example embodiments, there is provided an organic thin film transistor fabricated by the method. In accordance with example embodiments, there is provided a display device comprising the organic thin film transistor.

BRIEF DESCRIPTION OF THE DRAWINGS

Example embodiments will be more clearly understood from the following detailed description taken in conjunction with the accompanying drawings.

FIG. 1 shows schematic views illustrating the selective reduction of an oxidized semiconductor material and the selective formation of metal particles in accordance with example embodiments;

FIG. 2 shows optical micrographs of organic thin film transistors fabricated in Example 1 and Comparative Example 1, each of which shows a semiconductor layer and source/drain electrodes to confirm whether or not metal particles are formed within the semiconductor layer;

FIG. 3 shows graphs of measurement results for the contact resistance of organic thin film transistors fabricated in Example 1 and Comparative Example 1; and FIG. 4 is a graph showing the current transfer characteristics of organic thin film transistors fabricated in Example 1 and Comparative Example 1.

Figure 1:
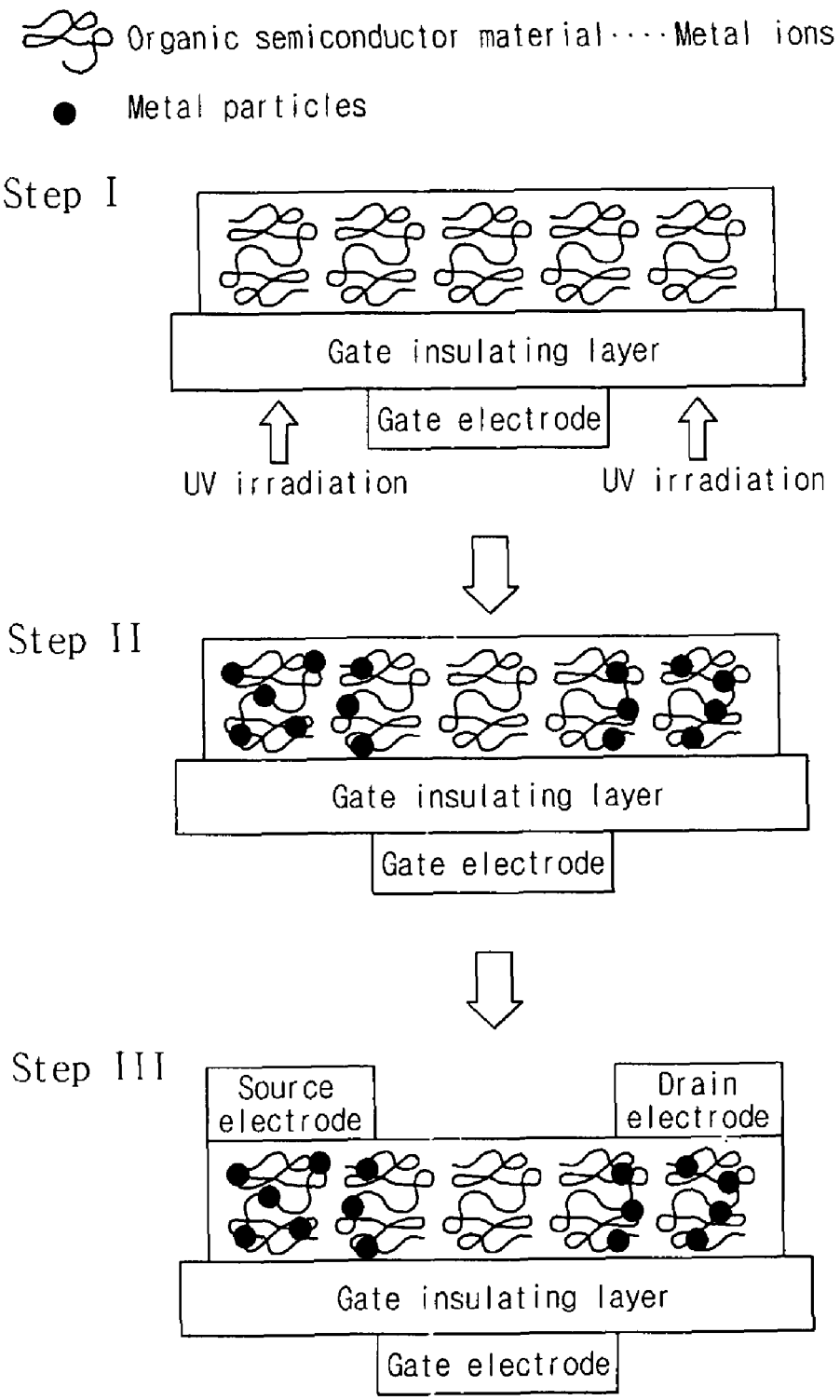
FIGS. 1-4 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. In particular, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will now be described in greater detail with reference to the accompanying drawings. In the drawings, the thicknesses and widths of layers are exaggerated for clarity. Example embodiments may, however, be embodied in many different forms and should not be construed as limited to the example embodiments set forth herein. Rather, these example embodiments are provided so that this disclosure will be thorough and complete, and will fully convey the scope of example embodiments to those skilled in the art.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments provide a method for fabricating an organic thin film transistor by oxidation and selective reduction of an organic semiconductor material. In example embodiments, the method may include forming a gate electrode on a substrate, forming a gate insulating layer on the gate electrode, applying an organic semiconductor material oxidized by a metal-based oxidant to the gate insulating layer to form a semiconductor layer, selectively reducing the semiconductor layer to selectively form metal particles therein, and forming source/drain electrodes on the selectively reduced portions of the semiconductor layer.

According to example embodiments, the semiconductor material may be oxidized by metal ions contained in the metal-based oxidant and may then be selectively reduced to selectively form metal particles within portions of the semiconductor layer, which may be in contact with the source/drain electrodes to create interfaces. The oxidation and the selective reduction may allow the semiconductor layer to have metallic characteristics identical or similar to those of the source/drain electrodes, which may be essentially composed of a metal, e.g., gold (Au) and/or copper (Cu), so that there may be stability at the interfaces between the semiconductor layer and the source/drain electrodes. As a result, contact resistance and carrier injection barrier at the interfaces may be minimized or decreased.

Therefore, an organic thin film transistor fabricated by the method according to example embodiments may exhibit improved performance characteristics in terms of electrical properties, e.g., increased charge carrier mobility. Based on these advantages, the organic thin film transistor may be effectively applied to a variety of display devices, including liquid crystal displays, plasma displays, field emission displays, light-emitting diodes and/or organic electroluminescence (EL) displays.

A more detailed explanation of the method according to example embodiments will be given hereinafter. After a substrate is washed to remove impurities present therein by a common process, a gate electrode may be formed on the substrate.

A material for the substrate may be suitably selected from silica, glass and/or plastic by those skilled in the art according to the application of the substrate so long as the object of example embodiments may not be impaired. Non-limiting examples of plastic substrates may include polyethylenenaphthalate, polyethyleneterephthalate, polycarbonate, polyvinylbutyral, polyacrylate, polyimide, polynorbornene and/or polyethersulfone substrates.

The gate electrode may be made of any common material. Specific examples of suitable materials for the gate electrode may include metals, e.g., gold (Au), silver (Ag), aluminum (Al), nickel (Ni), molybdenum (Mo), tungsten (W) and chromium (Cr), and alloys thereof, e.g., molybdenum/tungsten (Mo/W) alloys, metal oxides, e.g., indium-tin oxide (ITO) and indium-zinc oxide (IZO), and electrically conductive polymers, e.g., polythiophene, polyaniline, polyacetylene, polypyrrole, polyphenylene vinylene, and polyethylenedioxythiophene (PEDOT)/polystyrenesulfonate (PSS) mixtures. These materials may be used alone or as a mixture of two or more thereof.

The gate electrode may be formed, without limitation, by any process well known in the art, for example, a deposition process (e.g., sputtering or vacuum evaporation) or a solution process (e.g., spin coating). If needed, patterning may be further performed by a common technique.

The thickness of the gate electrode may be suitably determined by those skilled in the art according to the intended purposes and applications. The thickness of the gate electrode may be in the range of about 500 Å to about 2,000 Å.

A gate insulating layer may be formed on the gate electrode by a common process. The gate insulating layer may be formed of a common high-dielectric constant insulator. Specific examples of suitable insulators may include, but may not be limited to, ferroelectric insulators, e.g., $Ba_{0.33}Sr_{0.66}TiO_3$ (BST), $Al_2O_3$, $Ta_2O_5$, $La_2O_5$, $Y_2O_3$ and $TiO_2$, inorganic insulators, e.g., $PbZr_{0.33}Ti_{0.66}O_3$ (PZT), $Bi_4Ti_3O_{12}$, $BaMgF_4$, $SrBi_2(TaNb)_2O_9$, $Ba(ZrTi)O_3$ (BZT), $BaTiO_3$, $SrTiO_3$, $Bi_4Ti_3O_{12}$, $SiO_2$, $SiN_x$ and AlON, and organic insulators, e.g., polyimide, benzocyclobutene (BCB), parylene, polyacrylate, polyvinyl alcohol and polyvinyl phenol.

The thickness of the gate insulating layer may be appropriately varied by those skilled in the art according to the intended applications and purposes and may be in the range of about 1,000 Å to about 10,000 Å. Coating processes suitable to form the gate insulating layer may not be especially limited, and examples thereof may include vacuum evaporation and solution processes, e.g., spin coating, inkjet printing and printing. If needed, soft baking may be performed at about 60° C. to about 150° C. for about 1 minute to about 10 minutes, or hard baking may be performed at about 100° C. to about 200° C. for about 30 minutes to about 3 hours.

A semiconductor layer may be formed on the gate insulating layer using an organic semiconductor material oxidized by a metal-based oxidant. Specifically, applying the organic semiconductor material oxidized by a metal-based oxidant to the gate insulating layer to form a semiconductor layer may include dissolving an organic semiconductor material in a solvent to prepare an organic semiconductor solution, dissolving a metal-based oxidant in a solvent to prepare an oxidant solution, and applying a mixed solution of the organic semiconductor solution and the oxidant solution to the gate insulating layer.

Any known metal-based oxidant may be suitably used so long as example embodiments may not be impaired. The metal-based oxidant may be a material represented by Formula 1 or 2:

$$A_nB_m \qquad (1)$$

wherein A may be selected from the group consisting of gold (Au), platinum (Pt), palladium (Pd), silver (Ag) and copper (Cu), B may be selected from the group consisting of Cl, acetate (OAc) and $NO_3$, n may be about 1 or greater, and m may be equal to or greater than n; or

$$H_lA_nB_m \qquad (2)$$

wherein A, B, n and m may be as defined in Formula 1, and l may be about 1 or greater.

In Formulae 1 and 2, l and m each may be about 1 or about 2, and m may be an integer from about 1 to about 6.

For example, the metal-based oxidant may be selected from $HAuCl_4$, $HPdCl_2$, $AuCl_3$, $H_2PtCl_6$, $AgNO_3$, $CuCl_2$, $Pd(OAc)_2$ and mixtures thereof, but example embodiments may not be necessarily limited to these metal-based oxidants.

Metal ions contained in the metal-based oxidant may be identical to or different from those of a material for the source/drain electrodes. Taking into account the uniformity of the interfaces between the semiconductor layer and the source/drain electrodes and reduction of contact resistance at the interfaces, the characteristics of metal ions contained in the metal-based oxidant may be identical or similar to those of metal ions contained in a material for the source/drain electrodes.

In example embodiments, any organic semiconductor material known in the art may be used without limitation. A p-type conjugated organic polymer may be the organic semiconductor material taking into consideration the ease of oxidation by the metal ions and the usefulness of the resonance structure.

Specific examples of such organic semiconductor materials may include, but may not be limited to, poly-(3-hexylthiophene) (P3HT), polythiophene, polythiazole, poly(oligothiophene-thiazole), polyfluorene, polyvinylene phenylene and polypyrrole derivatives. These organic semiconductor materials may be used alone or as a mixture of two or more thereof. The molecular weight and degree of polymerization of the organic semiconductor material may be suitably determined by those skilled in the art according to the intended purposes and applications.

The concentrations of the organic semiconductor solution containing the organic semiconductor material and the oxidant solution containing the oxidant may be optionally varied by those skilled in the art according to the intended purposes and applications. The concentration of the organic semiconductor solution may be in the range of about 0.1 mM to about 1 mM and the concentration of the oxidant solution may be in the range of about 0.01 mM to about 30 mm, but these concentrations may not be limited to these ranges.

Solvents that may be used to prepare the respective solutions may be selected from general organic solvents, water and mixtures thereof, and specific examples thereof may include, but may not be limited to organic solvents, e.g., alcohols (e.g., ethanol), ethers, chlorinated alkanes, aromatic solvents and glycols, water, mixed organic solvents, and mixtures of water and one or more organic solvents. Depending on the kind and application of the organic semiconductor material and the oxidant used, those skilled in the art may select at least one solvent from the aforementioned solvents.

The solvent used to prepare the organic semiconductor solution may be identical to or different from that used to prepare the oxidant solution. In view of uniformity and ease of the application, the characteristics of the solvent used to prepare the organic semiconductor solution may be identical or similar to those of the solvent used to prepare the oxidant solution.

Mixing of the organic semiconductor solution and the oxidant solution causes the metal ions contained in the oxidant to form a complex with the organic semiconductor material. For example, the organic semiconductor material may be oxidized. The oxidized semiconductor material may be applied to the gate insulating layer by a common process to form the desired semiconductor layer.

The mixing ratio of the organic semiconductor solution to the oxidant solution may be appropriately adjusted by those skilled in the art according to the intended purposes and applications, and may be between about 1:1 and about 1:10 (v/v), for example, between about 1:1 and about 1:3 (v/v), but may not be necessarily limited to these ranges.

In example embodiments, the degree of oxidation of the organic semiconductor material may be controlled by varying the concentration of the organic semiconductor solution, the concentration of the oxidant solution and the mixing ratio between the two solutions. This control enables adjustment of the density of metal particles at the interfaces between the semiconductor layer and the source/drain electrodes in the subsequent selective reduction of the semiconductor layer, and as a result, carrier injection barrier and contact resistance at the interfaces may be accurately controlled.

On the other hand, examples of suitable processes to apply the mixed solution to the gate insulating layer may include, but may not be limited to, printing, screen printing, spin coating, dipping, ink spraying, vacuum evaporation and thermal evaporation. If needed, the baking may be performed after the application. The baking may be performed at about 20° C. to about 200° C. for about 1 minute to about 5 hours, but may not be particularly limited to these conditions. In example embodiments, the semiconductor layer may have a thickness of about 300 Å to about 10,000 Å. The semiconductor layer may be patterned by a common technique according to the intended applications and needs.

The semiconductor layer may be selectively reduced to selectively form metal particles within the reduced portions of the semiconductor layer. For example, only portions of the semiconductor layer, which may be formed of the organic semiconductor material oxidized by the metal ions contained in the oxidant, in contact with source/drain electrodes to be formed to create interfaces, may be selectively reduced by any reduction treatment to selectively form metal particles within the reduced portions of the semiconductor layer. The selective reduction of the semiconductor layer and the selective formation of the metal particles are schematically illustrated in FIG. 1.

The selective formation of the metal particles may impart metallic characteristics identical or similar to those of source/drain electrodes to the semiconductor layer and may provide better transport paths of carriers so that stability at interfaces between the semiconductor layer and the source/drain electrodes may be guaranteed, resulting in minimization or reduction of contact resistance and carrier injection barrier between the semiconductor layer and the source/drain electrodes, and improvement of the electrical properties of the final organic thin film transistor.

Any treatment that may reduce the oxidized semiconductor material may be employed to selectively reduce the semiconductor layer. The selective reduction treatment may be, for example, irradiation with UV, e-beam, laser and/or x-rays.

Taking into consideration various factors, e.g., density of metal particles to be formed, the conditions for the irradiation, e.g., UV irradiation, may be appropriately varied by those skilled in the art according to the intended applications and purposes. For example, the semiconductor layer may be irradiated with UV light of about 200 nm to about 500 nm at about 10 W to about 1,000 W.

The size of metal particles to be formed may be suitably determined by those skilled in the art according to the intended applications and purposes. For example, the metal particles may have a size of about several to about several tens of micrometers. Source/drain electrodes may be formed on the selectively reduced portions of the semiconductor layer, in which metal particles may be previously formed, by a common process.

Any material commonly used in the art may be used to form the source/drain electrodes so long as example embodiments may not be impaired. Specific examples of such materials for the source/drain electrodes may include metals, including gold (Au), platinum (Pt), palladium (Pd), silver (Ag), copper (Cu), aluminum (Al), nickel (Ni) and chromium (Cr), and alloys thereof, metal oxides, including indium-tin oxide (ITO) and indium-zinc oxide (IZO), electrically conductive polymers, including polythiophene, polyaniline, polyacetylene, polypyrrole, polyphenylene vinylene, and polyethylenedioxythiophene (PEDOT)/polystyrenesulfonate (PSS) mixtures, and mixtures thereof. The metals and alloys thereof may be materials for source/drain electrodes.

Any known process, for example, sputtering, vacuum evaporation, spin coating, inkjet printing, printing or dipping, may be employed to form the source/drain electrodes. The source/drain electrodes may be patterned by a common technique according to the intended applications and needs, and if needed, baking may be performed. The thickness of the source/drain electrodes may be appropriately determined by those skilled in the art and may be in the range of about 500 Å to about 2,000 Å.

Example embodiments are directed to an organic thin film transistor fabricated by the method. The organic thin film transistor may have a top contact structure comprising a substrate, a gate electrode formed on the substrate, a gate insulating layer formed on the gate electrode, a semiconductor layer formed on the gate insulating layer, and source/drain electrodes formed on the semiconductor layer wherein the semiconductor layer contains metal particles within portions in contact with the source/drain electrodes and an organic semiconductor material oxidized by metal ions within the remaining portion.

The organic thin film transistor according to example embodiments may not be restricted to the top contact structure, and may have a modified structure so long as example embodiments may not be impaired. The organic thin film transistor may further include constituent elements selected from data lines and banks.

Any metal or metal oxide known in the art may be used to form the data lines. Specific examples of suitable materials for the data lines may include, but may not be limited to, metals, e.g., gold, silver, aluminum, nickel, molybdenum and chromium, alloys thereof, metal oxides, e.g., indium-tin oxide and indium-zinc oxide, and mixtures thereof.

The banks may be formed on the semiconductor layer or the source/drain electrodes. The banks may be freely formed using a material known in the art without limitation by a common technique.

The organic thin film transistor according to example embodiments may have a relatively low contact resistance between the semiconductor layer and the source/drain electrodes, indicating ohmic contact of the transistor. In addition, the organic thin film transistor may have an increased on-current, indicating improved electrical properties of the transistor.

Therefore, the organic thin film transistor may be effectively applied to a variety of display devices. Example embodiments may be directed to a display device comprising the organic thin film transistor.

There may be no particular restriction as to the kind of the display device, but there may be exemplified a liquid crystal display, a plasma display, a field emission display, a light-emitting diode or an organic electroluminescence (EL) display. The organic thin film transistor may be applied to the display device, without limitation, by any common technique generally known in the art.

Hereinafter, example embodiments will be explained in more detail with reference to the following examples. However, these examples are given for the purpose of illustration and are not to be construed as limiting the scope of example embodiments.

EXAMPLES

Example 1

A molybdenum/tungsten (Mo/W) alloy was deposited to a thickness of about 1,000 Å on a clean glass substrate by sputtering to form a gate electrode. An organic-inorganic hybrid insulator was spin-coated to a thickness of about 7,000 Å on the gate electrode to form a gate insulating layer. A poly(oligothiophene-thiazole) derivative (molecular weight: about 15,000 g/mol, degree of polymerization: about 20) was dissolved in chlorobenzene to prepare an about 1 mM solution of the organic semiconductor material, and an oxidant ($HAuCl_4$) was dissolved in chlorobenzene to prepare an about 0.1 mM solution of the oxidant. The organic semiconductor solution was mixed with the oxidant solution in a volume ratio of about 1:1 to oxidize the semiconductor material. The mixed solution was spin-coated at about 1,000 rpm to a thickness of about 7,000 Å on the gate insulating layer. The resulting structure was baked under an argon atmosphere at about 100° C. for about 30 minutes to form a semiconductor layer. UV light (about 254 nm, about 30 W) was irradiated on portions of the semiconductor layer in contact with source/drain electrodes to be formed to create interfaces, to reduce the oxidized semiconductor material, e.g. the oxidized poly(oligothiophene-thiazole) derivative. As a result, gold (Au) particles were formed within the portions. Gold (Au) was deposited to a thickness of about 700 Å on the selectively reduced portions of the semiconductor layer, in which the gold particles were formed, to form source/drain electrodes, completing the fabrication of an organic thin film transistor.

Comparative Example 1

An organic thin film transistor was fabricated in the same manner as in Example 1, except that a poly(oligothiophene-thiazole) derivative (molecular weight: about 15,000 g/mol, degree of polymerization: about 20) was spin-coated at about 1,000 rpm to a thickness of about 7,000 Å and baked under an argon atmosphere at about 100° C. for about 30 minutes to form a semiconductor layer, and that UV light was not irradiated on the semiconductor layer.

1. Confirmation of Formation of Metal Particles

Figure 2:
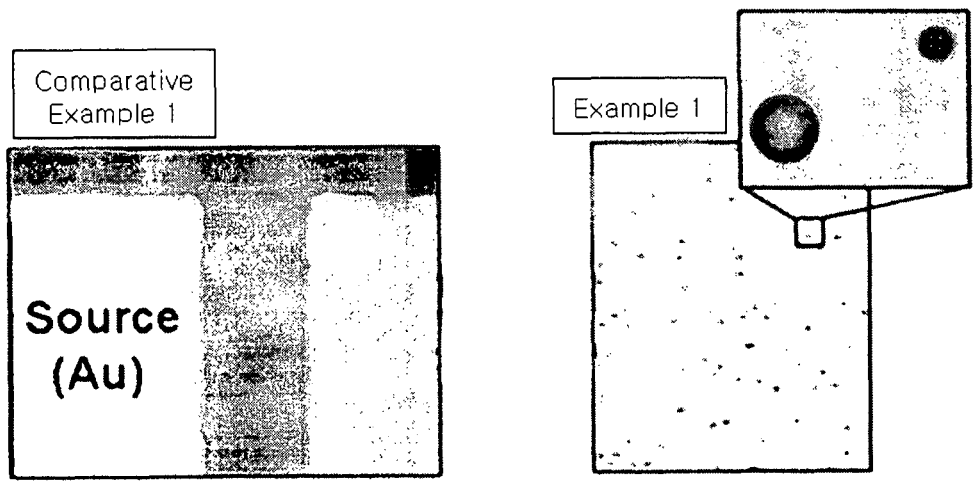

An optical micrograph of each of the organic thin film transistors fabricated in Example 1 and Comparative Example 1 was taken in order to confirm whether or not metal (Au) particles were formed within portions of the semiconductor layer in contact with the source/drain electrodes to create interfaces. The results are shown in FIG. 2. The micrographs of FIG. 2 reveal that no gold (Au) particles were formed within the semiconductor layer of the organic thin film transistor fabricated in Comparative Example 1, whereas metal particles were actually formed within portions of the semiconductor layer in contact with the source/drain electrodes.

2. Measurement of Contact Resistance

I-V curves of the organic thin film transistors fabricated in Example 1 and Comparative Example 1 were plotted, and the contact resistance values of the devices were measured from the I-V curves. The results are shown in FIG. 3.

Figure 3:
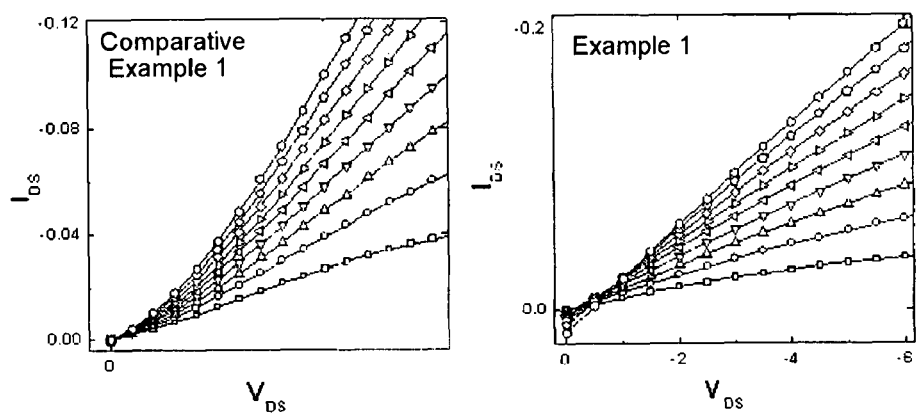

FIG. 3 confirms that there was a relatively great difference in contact resistance between the organic thin film transistors due to the selective reduction by UV irradiation and the formation of the metal particles. For example, the organic thin film transistor fabricated without any treatment in Comparative Example 1 showed non-ohmic contact in "S" configuration, while the organic thin film transistor fabricated in Example 1 showed ohmic contact.

3. Measurement of Electrical Properties

To evaluate the electrical properties of the organic thin film transistors fabricated in Example 1 and Comparative Example 1, the current transfer characteristics of the devices were measured using a semiconductor analyzer (4200-SCS, KEITHLEY). The results are shown in FIG. 4.

Figure 4:
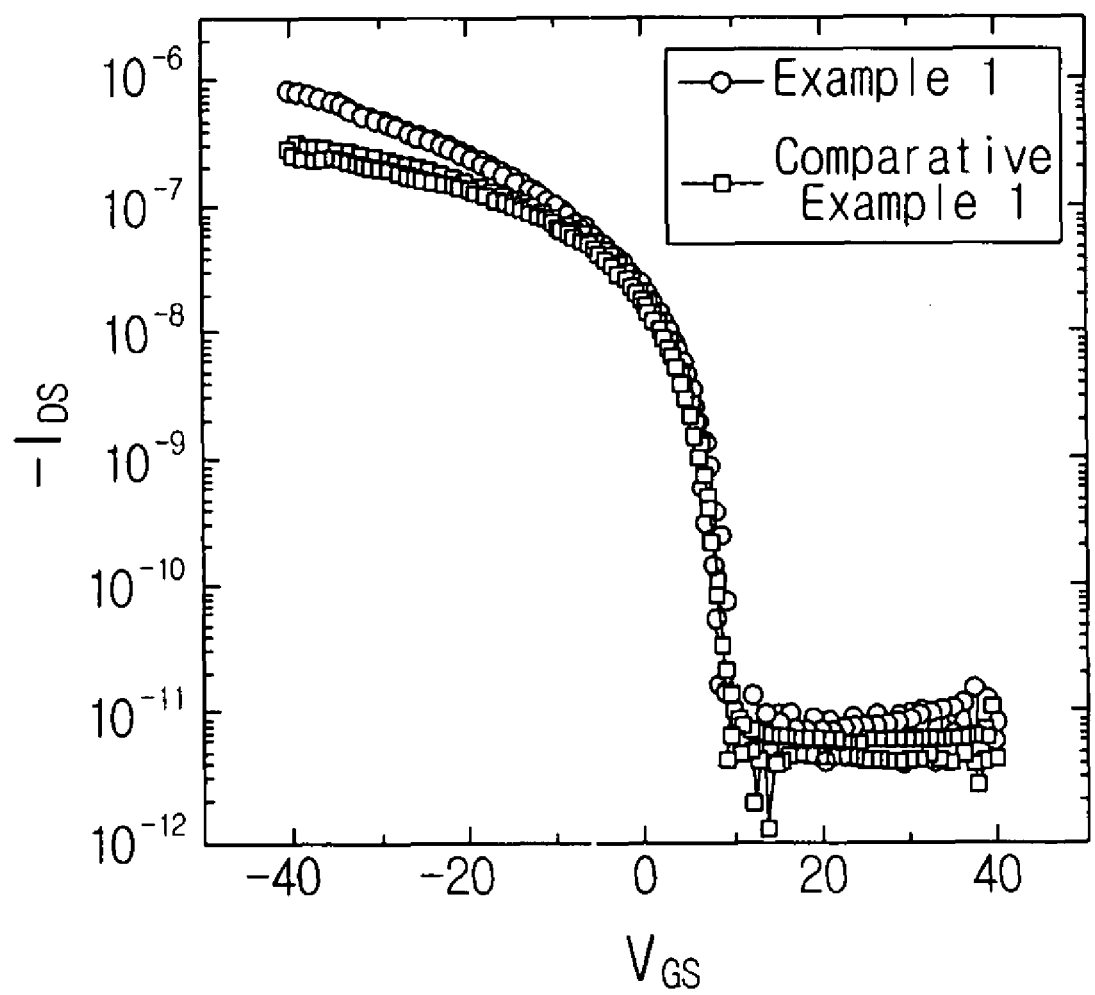

From the graph of FIG. 4, the organic thin film transistor fabricated in Example 1 illustrates an increased current in the 'on' state when compared to the organic thin film transistor fabricated in Comparative Example 1. This increase in on-current may be due to the stability of the interfaces between the semiconductor layer and the source/drain electrodes of the organic thin film transistor.

The charge carrier mobility, on-current ($I_{on}$), off-state leakage current ($I_{off}$), threshold voltage ($V_t$) and hysteresis (Hys) of the organic thin film transistors fabricated in Example 1 and Comparative Example 1 were measured as follows.

The charge carrier mobility of the devices was calculated from the slope of a graph representing the relationship between $(I_{SD})^{1/2}$ and $V_G$, which was plotted from the following current equations in the saturation region:

$$I_{SD} = \frac{WC_0}{2L} \mu (V_G - V_T)^2$$

$$\sqrt{I_{SD}} = \sqrt{\frac{\mu C_0 W}{2L}} (V_G - V_T)$$

$$\text{slope} = \sqrt{\frac{\mu C_0 W}{2L}}$$

$$\mu_{FET} = (\text{slope})^2 \frac{2L}{C_0 W}$$

In the above equations, $I_{SD}$: source-drain current, $\mu$ and $\mu_{FET}$: charge carrier mobility, $C_o$: capacitance of oxide film, W: channel width, L: channel length, $V_G$: gate voltage, and $V_T$: threshold voltage.

The on-current ($I_{on}$) of the devices was determined as the maximum amount of current.

The off-state leakage current ($I_{off}$) of the devices, which is a current flowing in the 'off' state, was determined by measuring the minimum current in the 'off' state in the current ratio.

The threshold ($V_t$) of the devices was obtained from a value of a base voltage ($V_G$) axis intercept in the I-V graph.

The hysteresis (Hys) of the devices was calculated as a difference in threshold voltage between forward steep and backward steep.

The results are shown in Table 1.

TABLE 1

|  | $I_{on}$ (A) | $I_{off}$ (A) | Charge carrier Mobility ($cm^2/Vs$) | Hys (V) | $V_t$ (V) |
|---|---|---|---|---|---|
| Comparative Example 1 | $3.02 \times 10^{-7}$ | $1.21 \times 10^{-12}$ | 0.022 | 2.0 | 6.2 |
| Example 1 | $8.45 \times 10^{-7}$ | $4.01 \times 10^{-12}$ | 0.100 | 2.0 | 8.3 |

As may be seen from the results of Table 1, the on-current of the organic thin film transistor fabricated in Example 1 was improved when compared to that of the organic thin film transistor fabricated in Comparative Example 1, and as a result, the charge carrier mobility of the organic thin film transistor fabricated in Example 1 was about five times higher than that of the organic thin film transistor fabricated in Comparative Example 1.

Although example embodiments have been described herein in detail, those skilled in the art to which example embodiments pertain will appreciate that various modifications are possible, without departing in any way from the spirit and scope of the claims which follows. It is to be understood that such modifications of the foregoing embodiments fall within the scope of example embodiments.

As apparent from the above description, the method according to example embodiments may use oxidation and selective reduction of an organic semiconductor material. According to the method, stability of interfaces between a semiconductor layer and source/drain electrodes of an organic thin film transistor may be guaranteed. Therefore, an organic thin film transistor fabricated by the method may exhibit improved performance characteristics, e.g., minimized or decreased contact resistance and increased charge carrier mobility.

What is claimed is:

1. A method for fabricating an organic thin film transistor, the method comprising:
   forming a gate electrode on a substrate;
   forming a gate insulating layer on the gate electrode;
   applying an organic semiconductor material oxidized by a metal-based oxidant to the gate insulating layer to form a semiconductor layer;
   selectively reducing the semiconductor layer to selectively form metal particles therein; and
   forming source/drain electrodes on the selectively reduced portions of the semiconductor layer.

2. The method according to claim 1, wherein the metal-based oxidant is a material represented by Formula 1 or 2:

$$A_n B_m \quad (1)$$

wherein A is selected from the group consisting of gold (Au), platinum (Pt), palladium (Pd), silver (Ag) and copper (Cu), B is selected from the group consisting of Cl, acetate (OAc) and $NO_3$, n is about 1 or greater, and m is equal to or greater than n; or $$H_l A_n B_m \quad (2)$$

wherein A, B, n and m are as defined in Formula I, and l is about 1 or greater.

3. The method according to claim 2, wherein the metal-based oxidant is selected from the group consisting of $HAuCl_4$, $HPdCl_2$, $AuCl_3$, $H_2PtCl_6$, $AgNO_3$, $CuCl_2$, $Pd(OAc)_2$, and mixtures thereof.

4. The method according to claim 1, wherein the organic semiconductor material is a p-type conjugated polymer.

5. The method according to claim 4, wherein the organic semiconductor material is selected from the group consisting of poly-(3-hexylthiophene), polythiophene, polythiazole, poly(oligothiophene-thiazole), polyfluorene, polyvinylene phenylene and polypyrrole derivatives.

6. The method according to claim 1, wherein applying the organic semiconductor material includes:
   dissolving an organic semiconductor material in a solvent to prepare an organic semiconductor solution;
   dissolving a metal-based oxidant in a solvent to prepare an oxidant solution; and
   mixing the organic semiconductor solution with the oxidant solution and applying the mixed solution to the gate insulating layer.

7. The method according to claim 6, wherein each of the organic semiconductor and oxidant solvents is selected from the group consisting of organic solvents, water and mixtures thereof.

8. The method according to claim 6, wherein the organic semiconductor solution has a concentration in the range of about 0.1 mM to about 1 mM and the oxidant solution has a concentration in the range of about 0.01 mM to about 30 mM.

9. The method according to claim 6, wherein the organic semiconductor solution is mixed with the oxidant solution in a volume ratio of about 1:1 to about 1:5.

10. The method according to claim 6, wherein the application is performed by printing, screen printing, spin coating, dipping, ink spraying, vacuum evaporation, or thermal evaporation.

11. The method according to claim 1, wherein the selective reduction of the semiconductor layer is performed by irradiation with UV, e-beam, laser or x-rays.

12. The method according to claim 11, wherein the irradiation is conducted at a wavelength of about 200 nm to about 500 nm and a power of about 10 W to about 1,000 W.

13. The method according to claim 1, wherein the source/drain electrodes are made of a material selected from the group consisting of metals and alloys thereof, and electrically conductive polymers.

14. The method according to claim 13, wherein the metals include gold (Au), platinum (Pt), palladium (Pd), silver (Ag), copper (Cu), aluminum (Al), nickel (Ni) and chromium (Cr), and the alloys of the metals include molybdenum/tungsten (Mo/W) alloys, metal oxides, including indium-tin oxide (ITO) and indium-zinc oxide (IZO).

15. The method according to claim 13, wherein the electrically conductive polymers include polythiophene, polyaniline, polyacetylene, polypyrrole, polyphenylene vinylene, and polyethylenedioxythiophene (PEDOT)/polystyrenesulfonate (PSS) mixtures.

16. A method of fabricating a display device comprising fabricating the organic thin film transistor in accordance with claim 1.

17. An organic thin film transistor, comprising:
a gate electrode on a substrate;
a gate insulating layer on the gate electrode;
an organic semiconductor material, oxidized by a metal-based oxidant, on the gate insulating layer constituting a semiconductor layer;
a semiconductor layer including the organic semiconductor material oxidized by the metal-based oxidant and reduced portions that are selectively reduced to selectively form metal particles therein; and
source/drain electrodes on the selectively reduced portions of the semiconductor layer.

18. A display device comprising the organic thin film transistor according to claim 17.

* * * * *